United States Patent [19]

Morita

[11] Patent Number: 5,705,914
[45] Date of Patent: Jan. 6, 1998

[54] OVERVOLTAGE DETECTING APPARATUS FOR COMBINATION BATTERY

[75] Inventor: Koji Morita, Kanagawa-ken, Japan

[73] Assignee: Nissan Motor Co., Ltd., Yokohama, Japan

[21] Appl. No.: 756,637

[22] Filed: Nov. 26, 1996

[30] Foreign Application Priority Data

Dec. 4, 1995 [JP] Japan .................. 7-315140

[51] Int. Cl.$^6$ .................. H01M 10/46
[52] U.S. Cl. .................. 320/17; 320/48
[58] Field of Search .................. 320/6, 7, 15, 16, 320/17, 32, 39, 48

[56] References Cited

U.S. PATENT DOCUMENTS

| | | | |
|---|---|---|---|
| 4,238,721 | 12/1980 | DeLuca et al. | 320/18 |
| 4,614,905 | 9/1986 | Petersson et al. | 320/18 |
| 5,387,857 | 2/1995 | Honda et al. | 320/18 |
| 5,438,250 | 8/1995 | Retzlaff | 320/17 |
| 5,469,042 | 11/1995 | Rühling | 320/17 |
| 5,504,415 | 4/1996 | Podrazhansky et al. | 320/18 |
| 5,578,914 | 11/1996 | Morita | 320/18 |

FOREIGN PATENT DOCUMENTS

7-336905  12/1995  Japan.

Primary Examiner—Peter S. Wong
Assistant Examiner—Patrick B. Law
Attorney, Agent, or Firm—Foley & Lardner

[57] ABSTRACT

An overvoltage detecting apparatus for a combination battery can easily detect whether an overvoltage detecting function is normal or not. In the overvoltage detecting apparatus, with respect to blocks of cells constituting the combination battery, reference voltage generators, voltage dividers, comparators, and switching circuits for performing an ON/OFF operation between the cells and the reference voltage generators are arranged, and an output from the comparator of an upper cell controls the switching circuit of the next lower cell, so that a detection result is sequentially transmitted to lower cell blocks. A control signal given from a battery controller to the uppermost cell block is changed, and the normality/abnormality of the overvoltage detecting function is determined by checking whether a detection signal follows the control signal.

4 Claims, 12 Drawing Sheets

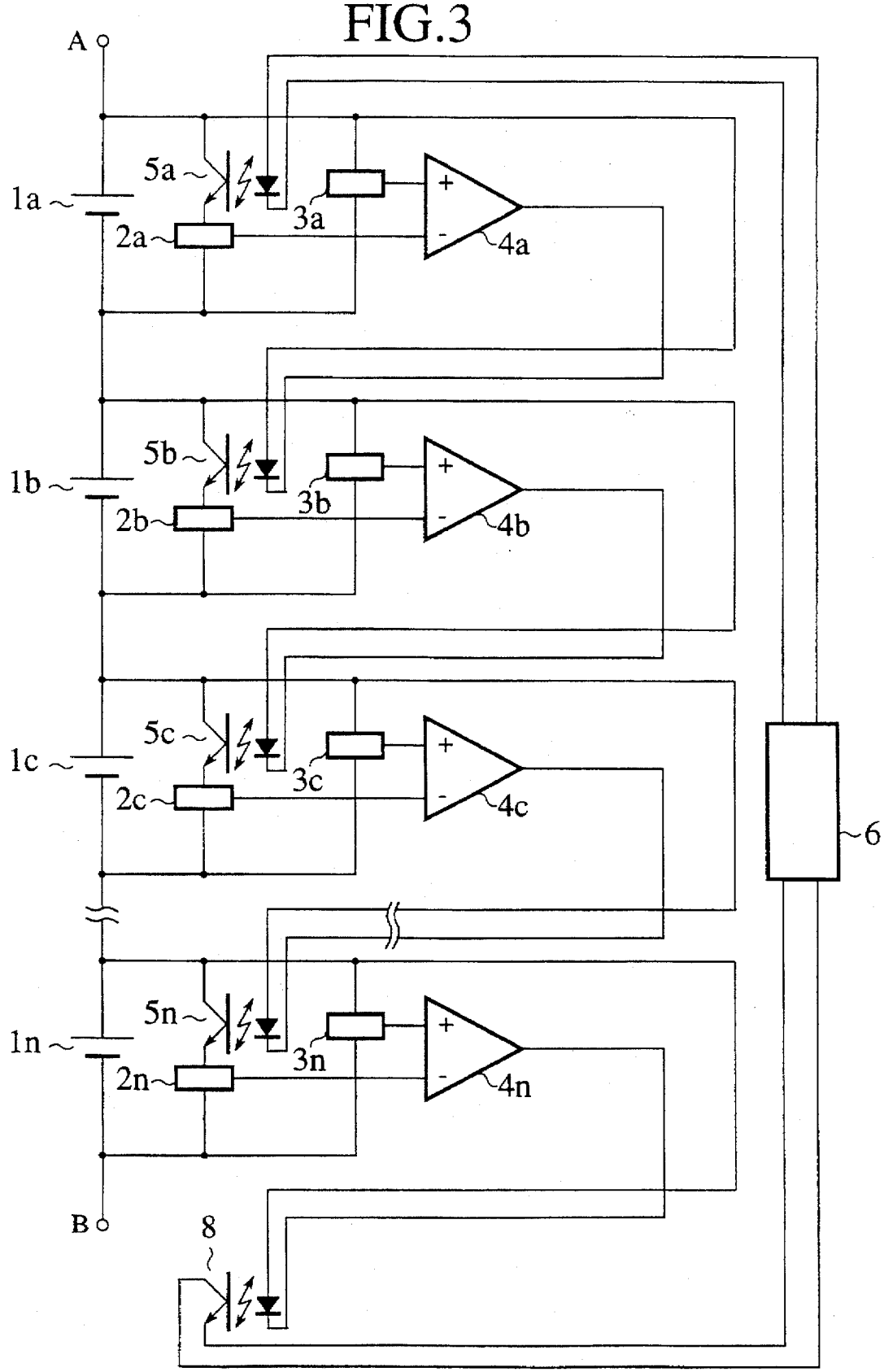

(a) DIVIDED CELL VOLTAGE
(b) REFERENCE VOLTAGE GENERATOR OUTPUT VOLTAGE(P/C on)
(c) REFERENCE VOLTAGE GENERATOR OUTPUT VOLTAGE(P/C off)

FIG.6A

| BLOCK | a | b | c | ... | m-1 | m | m+1 | ... | n-2 | n-1 | n |
|---|---|---|---|---|---|---|---|---|---|---|---|
| COMPARATOR OUTPUT | LOW | LOW | LOW | ... | LOW | LOW | LOW | ... | LOW | LOW | LOW |

FIG.6B

| BLOCK | a | b | c | ... | m-1 | m | m+1 | ... | n-2 | n-1 | n |
|---|---|---|---|---|---|---|---|---|---|---|---|
| COMPARATOR OUTPUT | LOW | LOW | LOW | ... | LOW | HIGH | HIGH | ... | HIGH | HIGH | HIGH |

FIG.6C

| BLOCK | a | b | c | ... | m-1 | m | m+1 | ... | n-2 | n-1 | n |
|---|---|---|---|---|---|---|---|---|---|---|---|
| COMPARATOR OUTPUT | HIGH | HIGH | HIGH | ... | HIGH | HIGH | HIGH | ... | HIGH | HIGH | HIGH |

FIG.7

| STATE OF 5a | OUTPUT FROM COMPARATOR 4n OF LAST STAGE | | |
|---|---|---|---|
| ON | LOW | LOW | HIGH |
| OFF | LOW | HIGH | HIGH |
|  | ABNORMAL | NORMAL | ABNORMAL |

FIG.13

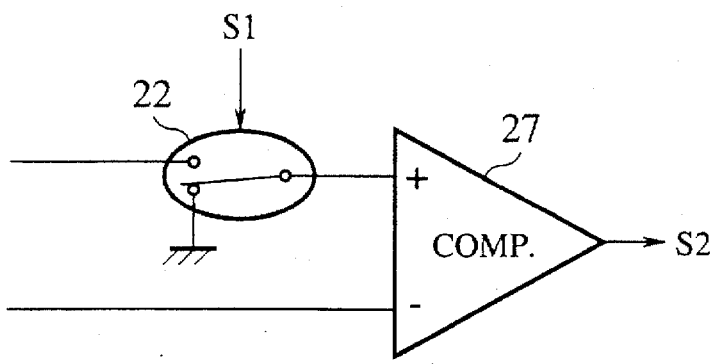

FIG.14A

OVERVOLTAGE DETERMINATION MODE

| CONTROL SIGNAL S1 | HIGH | |
|---|---|---|
| DETECTION SIGNAL S1' | HIGH | IN NORMAL VOLTAGE |
| DETECTION SIGNAL S1' | LOW | IN OVERVOLTAGE |

FIG.14B

INSPECTION MODE

| CONTROL SIGNAL S1 | HIGH | LOW | HIGH | |
|---|---|---|---|---|
| DETECTION SIGNAL S1' | HIGH | LOW | HIGH | NORMAL |
| DETECTION SIGNAL S1' | HIGH | HIGH | HIGH | ABNORMAL COMPARATOR |
| DETECTION SIGNAL S1' | LOW | LOW | LOW | ABNORMAL REFERENCE VOLTAGE OR ABNORMAL VOLTAGE DIVISION |
| DETECTION SIGNAL S1' | LOW | LOW | LOW | ABNORMAL REFERENCE VOLTAGE OR ABNORMAL VOLTAGE DIVISION |

OVERVOLTAGE DETECTING APPARATUS FOR COMBINATION BATTERY

BACKGROUND OF THE INVENTION

1. Field of the Invention

The present invention relates to an apparatus for detecting an overvoltage of a combination battery in which a plurality of secondary battery cells are connected parallel to each other or in serial with each other.

2. Description of the Related Art

As a drive source of an electric vehicle or the like, a combination battery in which a plurality of secondary battery cells (cell constituted by a single battery cell or a module constituted by a plurality of cells) are connected in serial or in serial-parallel with each other to obtain a required capacity. Since such a combination battery uses a large number of battery cells (for example, about 100 to 250 cells in an electric vehicle), it is important to assure the reliability of the battery system. More specifically, when some battery cell constituting a combination battery is damaged by overcharging or the like to loss its function, the function of the entire combination battery is degraded.

In addition, in the combination battery, respective battery cells have different degrees of decrease in discharge capacity (dischargeable electric amount), and the respective battery cells have variations of discharge capacities from a DOD (depth of discharge: 100% in entire discharge, 0% in full charge) of 0%. For this reason, in discharging, a battery cell having a small discharge capacity is rapidly discharged to be in an overdischarge state. The battery cell set in the overdischarge state serves as a load on other battery cells, the battery is lowered before all the battery cells have DOD of 100%. For this reason, discharge of the combination battery is completed. On the other hand, in charging, a battery cell whose DOD has not reached 100% reaches a DOD of 0% first, and its voltage increases moreover. When the charging is continues in this state, overcharge occurs. Generally, when a secondary battery is excessively charged over a charge end voltage, the service life of the secondary battery is shortened. In particular, a non-aqueous electrolytic secondary battery such as a lithium-ion battery, the above tendency is strong. For this reason, charging of the battery cell whose voltage reaches a charge end voltage must be ended.

As described above, in a combination battery constituted by a plurality of battery cells, the voltages of the respective battery cells are different from each other. For this reason, in order to avoid overcharging, the voltage of each battery cell must be detected. If the voltage of some battery cell reaches a charge end voltage, it is necessary that charging is ended or the battery cell whose voltage reaches the charge end voltage is controlled in such a manner a charge current flows in a bypass circuit arranged parallel to the battery cell, so that overcharging is prevented.

As an apparatus for detecting whether the voltage of each battery cell is an overvoltage, the apparatuses shown in FIGS. 1 and 2 are used.

Referring to FIGS. 1 and 2, reference numeral 1a to 1n denote cells constituting a combination battery; 2a to 2n, reference voltage generators; 3a to 3n, voltage dividers; 4a to 4n, comparators; 5a to 5n, photocouplers; and 6, a battery controller. A discharge circuit (control circuit and load) and a charge circuit (charger and control circuit) are connected to terminals A and B of the combination battery, so that charging/discharging is performed. This arrangement is omitted in FIGS. 1 and 2.

In the above circuit, the reference voltage generators 2a to 2n generate reference voltages corresponding to a charge end voltage on the basis of terminal voltages of the cells 1a to 1n, and voltages obtained by dividing the terminal voltages by the voltage dividers 3a to 3n are compared with the reference voltages by the comparator 4a to 4n to check whether the terminal voltages of the cells 1a to 1n reach the charge end voltage, i.e., become an overvoltage. When the terminal voltages become the overvoltage, the battery controller 6 stops charging to prevent overcharging, or a signal is supplied to a charge protective circuit (for example, bypass circuits parallelly connected to the cell, respectively) to control the cell whose voltage reaches the overvoltage to bypass a charging current, so that the combination battery can be protected from being overcharged.

In the overvoltage detecting apparatus for the combination battery described above, the cells constituting the combination battery are connected in serial with each other, the ground potentials (potentials on a low level side) of the respective cells are different from each other. For this reason, the reference voltage generators, the voltage dividers, and the comparators are driven by the voltages of the cells, respectively, and the ground potentials of those are also different from each other. Therefore, the outputs from the comparators are sent to the battery controller 6 after an insulating process is performed to the comparators by using the photocouplers 5a to 5n.

FIG. 1 shows an arrangement in which the output terminals of the photocouplers 5a to 5n are OR-connected, and FIG. 2 shows an arrangement in which the output terminals are AND-connected. In the above arrangements, batch processing is performed to suppress an increase in harness.

As described above, in the conventional apparatus, an overvoltage is detected by monitoring a change of a comparator output (for example, LOW→HIGH). For this reason, when the detecting circuit such as the comparator or the like is out of order, more specifically, when a failure occurs that the comparator output is kept at a normal level even if an overvoltage is generated, the overvoltage cannot be detected. As a result, the corresponding cell may be disadvantageously overcharged.

SUMMARY OF THE INVENTION

The present invention has been made to solve the above problems of the prior art, and has its object to provide an overvoltage detecting apparatus for a combination battery capable of easily checked whether an overvoltage detecting function is normal or not.

In order to achieve the above object, according to the present invention, arrangements are made according to the aspects of the present invention. More specifically, according to the first aspect of the present invention, there is provided an overvoltage detecting apparatus, for a combination battery, which detects an overvoltage of each cell of the combination battery constituted by connecting a plurality of secondary battery cells in serial or in serial-parallel with each other, comprising reference voltage generation means for generating a reference voltage corresponding to a charge end voltage by using a terminal voltage of the cell, voltage division means for dividing the terminal voltage of the cell at a predetermined division ratio, comparison means for comparing an output from the reference voltage generation means and an output from the voltage division means with each other, insulating type first switching means connected to perform an ON/OFF operation between the cell and the reference voltage generation means in accordance with a control signal, the means being arranged for each cell block, and the cell blocks of the combination battery being sequentially connected to each other such that an output from the comparison means of the cell block whose cell potential is higher by one is used as a control signal of the switching means, and control means for supplying a control signal to the first switching means of the cell block having the highest potential, inputting an output from the comparison means of the cell block having the lowest potential as a detection signal, fixing the control signal in a normal operation, determining an overvoltage by the detection signal, changing the control signal in a predetermined order in inspection, and determining the normality/abnormality of an overvoltage detecting function by checking whether the detection signal follows the change of the control signal.

As described above, in the first aspect of the present invention, detection results of cell blocks are sequentially transmitted to the lower cell blocks. For this reason, if an overvoltage detecting function is normal, when a control signal supplied from the control means to the cell block having the uppermost potential is changed, the change is sequentially transmitted to the cell block having the lowermost potential through the cell blocks, so that a detection signal input from the cell block having the lowermost potential to the control means is changed in accordance with the given control signal. On the other hand, when the overvoltage detecting function is abnormal, the change in control voltage is not transmitted. For this reason, the detection signal does not change even if the control signal is changed. Therefore, the normal/abnormal of the overvoltage detecting function can be determined by checking whether the detection signal follows the control signal.

Note that, when there is a cell whose voltage reaches the overvoltage, signal transmission is stopped by the block including the cell. For this reason, checking of the overvoltage detecting function must be performed when neither of the voltages of all the cells reach the overvoltage, e.g., before charging, or before traveling of an electric vehicle.

According to the second aspect of the present invention, a light-emitting diode which emits light in accordance with an output from the comparing means is arranged at every cell block of the combination battery.

With the above arrangement, when some cell has an overvoltage, a light-emitting diode connected to cells following the cell emits light or puts out, the cell having the overvoltage can be easily displayed.

According to the third aspect of the present invention, an insulating type second switching means which uses an output from the comparison means as a control signal and performs switching while being insulated from the cell is arranged for each of the cell blocks, so that the control signal is transmitted from the comparison means of a cell block having an upper potential to the first switching means of a cell block having a lower potential through the second switching means.

With the above arrangement, an output from each comparator is output while being insulated from the cells of the combination battery. For this reason, the lowermost cell block may have the same arrangement as each of the other cell blocks, and all the cell blocks can be manufactured by the same manner. For this reason, the cost can be reduced.

According to the fourth aspect of the present invention, there is provided an overvoltage detecting apparatus, for a combination battery, which detects an overvoltage of each cell of the combination battery constituted by connecting a plurality of secondary battery cells in serial or in serial-parallel with each other, comprising first reference voltage generation means for generating a reference voltage corresponding to a charge end voltage by using a terminal voltage of the cell, and second reference voltage generation means having the same arrangement as that of the first reference voltage generation means; first voltage division means for dividing the terminal voltage of the cell at a predetermined division ratio, and second voltage division means having the same arrangement as that of the first voltage division means; insulating type switching means for switchably outputting an output from the first reference voltage generation means and a ground potential in accordance with a control signal, the control signal being insulated from an input/output; comparison means for comparing an output from the insulating type switching means and an output from the first voltage division means; a first block constituted by first switching means for switchably outputting an output from the second reference voltage generation means and a ground potential in accordance with the control signal, a first amplification means for sending an output for inverting a first inversion means when a difference between an output from the first reference voltage generation means and an output from the first switching means exceeds a predetermined allowance error, and the first inversion means connected to an output of the first amplification means; a second block constituted by second switching means for switchably outputting an output from the first reference voltage generation means and a ground potential in accordance with the control signal, a second amplification means for sending an output for inverting a second inversion means when a difference between an output from the second reference voltage generation means and an output from the second switching means exceeds a predetermined allowance error, and the second inversion means connected to an output of the second amplification means; a third block constituted by third switching means for switchably outputting an output from the second voltage division means and a ground potential in accordance with the control signal, a third amplification means for sending an output for inverting a third inversion means when a difference between an output from the first voltage dividing means and an output from the third switching means exceeds a predetermined allowance error, and the third inversion means connected to an output of the third amplification means; a fourth block constituted by fourth switching means for switchably outputting an output from the first voltage division means and a ground potential in accordance with the control signal, a fourth amplification means for sending an output for inverting a fourth inversion means when a difference between an output from the second voltage dividing means and an output from the fourth switching means exceeds a predetermined allowance error, and the fourth inversion means connected to an output of the fourth amplification means;

the means and blocks being arranged for each cell, the first to fourth blocks being arranged in an arbitrary order, and being sequentially connected to each other such that an output from the comparison means is given as a control signal of the switching means of the first block, and an output from the inversion means of each block is used as a control signal of the switching means of the next block, and the cell blocks of the combination battery being sequentially connected to each other such that an output from the inversion means of the last block of the cell block whose cell potential is higher by one is used as a control signal of the insulating type switching means, and control means for supplying a control signal to the insulating type switching means of a cell block having the highest potential, inputting an output from the inversion means of the last block of a cell block having the lowest potential as a detection signal, fixing the control signal in a normal operation, determining an overvoltage by the detection signal, changing the control signal in a predetermined order in inspection, and determining the normality/ abnormality of an overvoltage detecting function by checking whether the detection signal follows the change of the control signal.

Therefore, when abnormality occurs in not only the comparing means as in the first aspect but also any circuit such as the reference voltage generating means or the voltage dividing means constituting the overvoltage detecting apparatus, a signal is transmitted from the upper cell block to the lower cell block. For this reason, the normality/ abnormality of the circuits constituting the apparatus can be determined by checking whether signal transmission is normally performed.

The nature, principle and utility of the invention will become more apparent from the following detailed description when read in conjunction with the accompanying drawings.

BRIEF DESCRIPTION OF THE DRAWINGS

In the accompanying drawings:

FIG. 3 is a circuit diagram showing the first embodiment of the present invention;

FIGS. 6A to 6C are tables showing the states of comparator outputs;

FIG. 7 is a table showing output states when the normal/ abnormal of an overvoltage detecting function is determined;

FIG. 13 is a circuit diagram showing the detail of a part of FIG. 12; and

FIGS. 14A and 14B are tables showing output states when the normal/abnormal of an overvoltage detecting function is determined.

DETAILED DESCRIPTION OF THE PREFERRED EMBODIMENTS

FIG. 3 is a diagram showing the first embodiment of the present invention.

Figure 1:
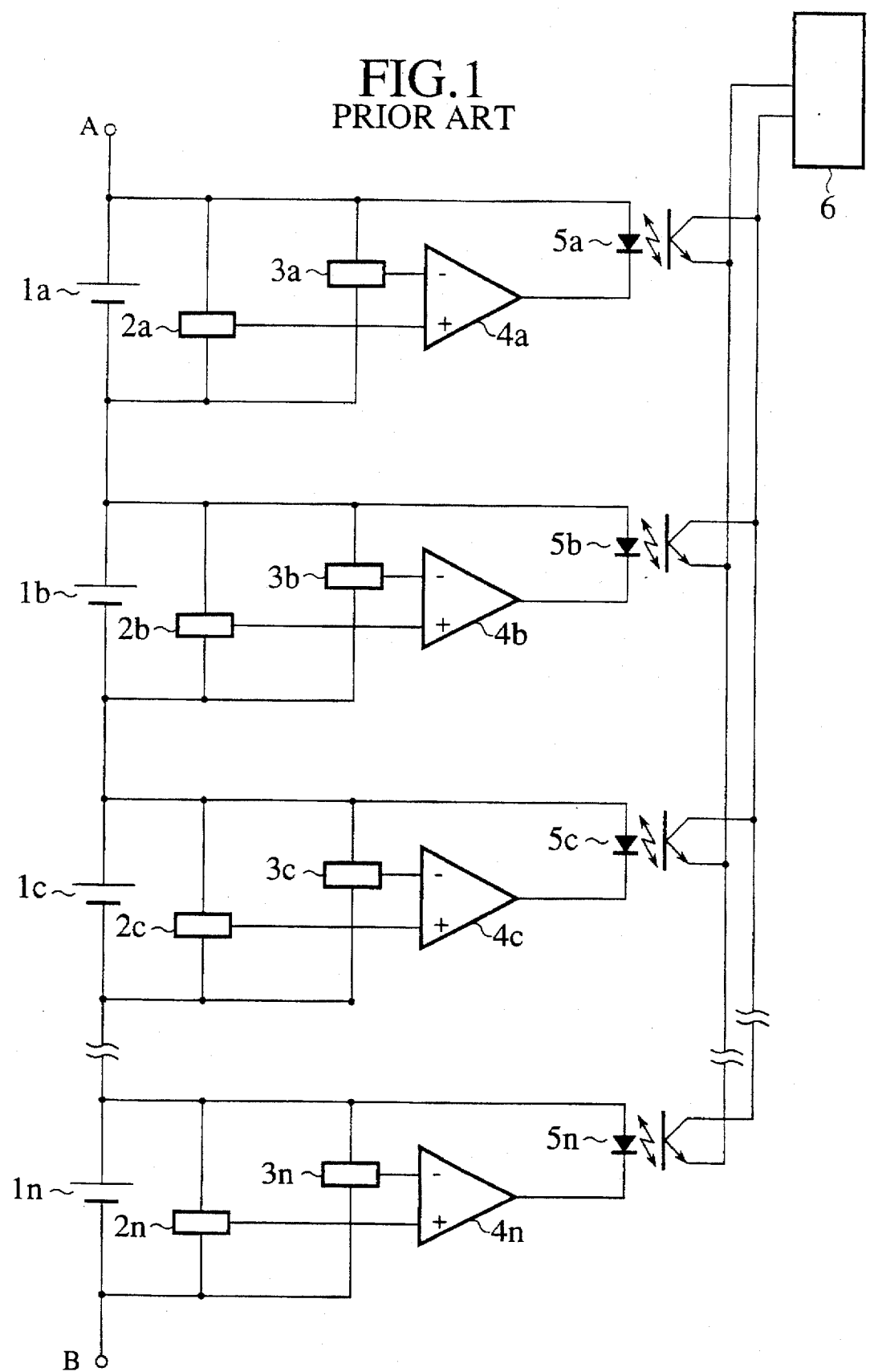
FIG. 1 is a circuit diagram showing a conventional overvoltage detecting apparatus.
Figure 2:
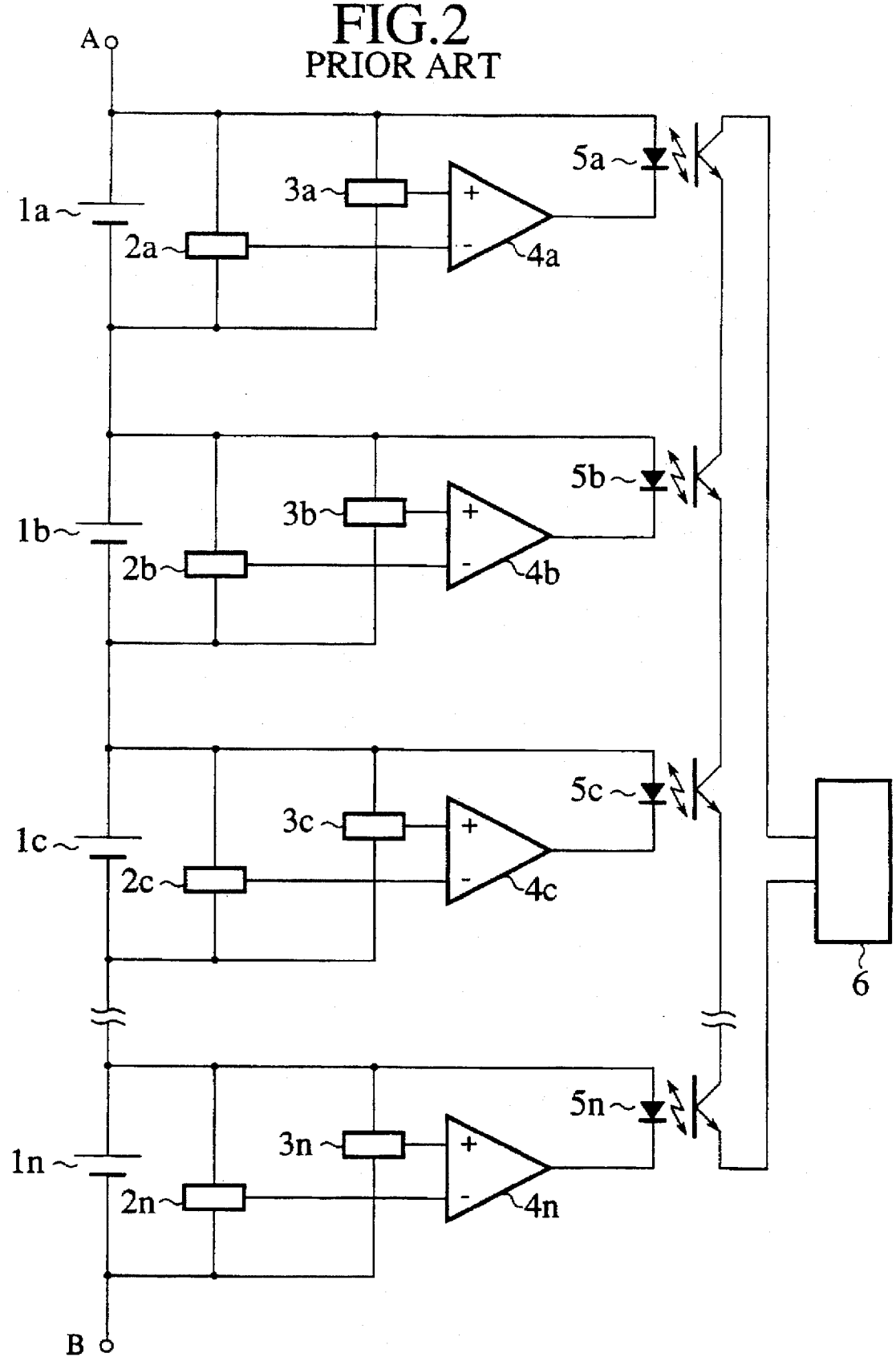
FIG. 2 is a circuit diagram showing another conventional overvoltage detecting apparatus.
Figure 4A:
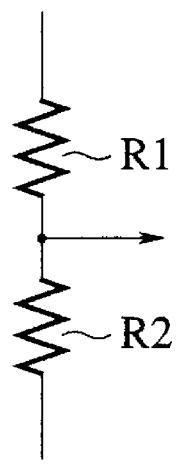
FIGS. 4A and 4B are circuit diagrams showing a voltage divider and a reference voltage generator.
Figure 4B:
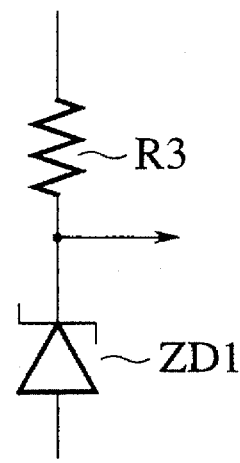

Referring to FIG. 3, reference numerals 1a to 1n denote cells constituting a combination battery. These cells are connected in serial with each other. The cells may be connected in serial-parallel with each other. Reference numeral 2a to 2n denote reference voltage generators. For example, as shown in FIG. 4B, the reference voltage generator is constituted by a series circuit of a resistor R3 and a zener diode ZD1, and generates a reference voltage corresponding to the charge end voltage (or value corresponding to a voltage slightly smaller or larger than a charge end voltage) by using the terminal voltages of respective cells. Since the reference voltage is obtained by dividing the terminal voltage of each cell, the reference voltage has a value obtained by multiplying a predetermined ratio (smaller than 1) to the charge end voltage. For this reason, voltage dividers 3a to 3n described below are arranged. More specifically, the voltage dividers 3a to 3n, as shown in FIG. 4A, is constituted by a series circuit of resistors R1 and R2, and outputs a voltage obtained by dividing the terminal voltage of each cell by a predetermined ratio (equal to the above-mentioned ratio).

Figure 5:
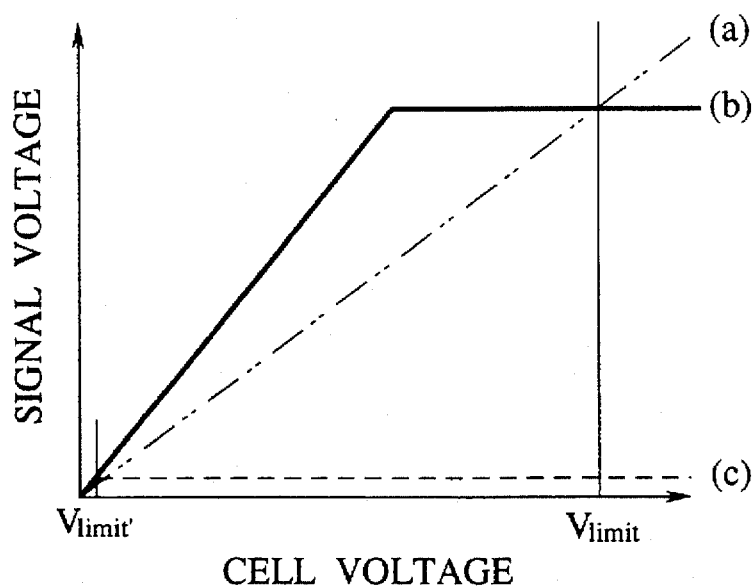
FIG. 5 is a graph showing the relationship between a reference voltage and an output from the voltage divider.

The relationship between the reference voltage and the output voltage of the voltage divider becomes the relationship shown in FIG. 5.

Referring to FIG. 5, (a) indicates an output voltage of a voltage divider, (b) indicates an output voltage of a reference voltage generator (when a photocoupler is in an ON state, i.e., when the reference voltage generator is connected to a cell), and (c) indicates an output voltage of the reference voltage generator (when the photocoupler is in an OFF state, i.e., when the reference voltage generator is not connected to the cell not to output a reference voltage). For this reason, the threshold value (reference voltage corresponding to a charge end voltage) of a comparator becomes $V_{limit}$ when the photocoupler is in an ON state, and the threshold value of the comparator becomes $V_{limit}$ ($\approx 0$) when the photocoupler is in an OFF state. Referring to FIG. 5, reference symbol P/C means a photocoupler.

Reference numerals 4a to 4n denote comparators. Each comparator is constituted by, e.g., an arithmetic amplifier, and compares the reference voltage and an output from the voltage divider. The output from the voltage divider is supplied to a non-inversion input terminal of the comparator and the reference voltage is supplied to an inversion input terminal of the comparator. The comparators are driven by voltages of the respective cells.

Reference numerals 5a to 5n and 8 denote photocouplers. Each photocoupler is an insulating type switching circuit which performs switching in a state wherein an input diode is insulated from a switching transistor, i.e., a control signal is insulated from an input/output. In place of photocouplers, relay circuits such as miniature electromagnetic relays may be used. A discharge circuit (control circuit and load) and a charge circuit (charger and control circuit) are connected to terminals A and B of the combination battery so as to perform charging/discharging. This arrangement is omitted in FIG. 3.

Reference numeral 6 denotes a battery controller. The battery controller is a circuit for detecting overvoltages of the respective cells and inspecting an overvoltage detecting function. In practice, the battery controller generally has a charge/discharge control function for the combination battery. However, in this embodiment, only overvoltage detection and inspection of the detecting function is described. This battery controller is constituted by, e.g., a microcomputer or the like.

Connection in the circuit shown in FIG. 3 is as follows. That is, cell blocks of the combination battery are connected to each other such that an output from a comparator of a cell block whose potential is higher than the potential of a given cell block (order of the potentials of the cells is given by $1a$, $1b$, $1c \ldots 1n$) is used as a control signal of a photocoupler. For example, the output of the uppermost comparator $4a$ is connected to the input diode of the second photocoupler $5b$, and the output of the second comparator $4b$ is connected to the input diode of the third photocoupler $5c$. In the above connection, an output from the comparator $4n$ of the cell block in having the lowermost potential is used as a control signal of the photocoupler 8, a control signal from the photocoupler $4a$ of the cell block $1a$ having the uppermost potential is given by the battery controller 6, and an output (detection signal) from the photocoupler 8 is input to the battery controller 6.

The function will be described next.

In a normal operation, a control signal given from the battery controller 6 to the uppermost photocoupler $5a$ is set to "HIGH". For this reason, since the input diode of the photocoupler $5a$ emits light, the switching transistor of the photocoupler $5a$ is turned on, and the terminal voltage of the cell $1a$ is applied to the reference voltage generator $2a$. Therefore, the reference voltage generator $2a$ generates a predetermined reference voltage, and the value of the predetermined reference voltage is compared with the output voltage of the voltage divider $3a$ by the comparator $4a$. The threshold value of the comparator $4a$ changes as shown in FIG. 5. When the terminal voltage of the cell $1a$ is lower than a charge end voltage, setting is performed such that (reference voltage)>(voltage divider output). For this reason, an output from the comparator $4a$ goes to "LOW" in a normal voltage range, and the input diode of the second photocoupler $5b$ emits light. Similarly, when the voltages of all the cells do not reach the charge end voltage, the switching transistors of all the photocouplers are turned on, a signal (e.g., HIGH) representing that the photocoupler 8 is in an ON state is input to the battery controller 6. In this manner, it is determined that any cell does not have an overvoltage. In this case, as shown in FIG. 6A, outputs from all the comparators go to "LOW".

On the other hand, the terminal voltage of any cell, e.g., the second cell $1b$ is equal to or higher than the charge end voltage, an output from the second comparator $4b$ goes to "HIGH", and the input diode of the third photocoupler $5c$ does not emit light. For this reason, the switching transistor of the photocoupler $5c$ is turned off, and an output from the reference voltage generator $2c$ goes to 0. For this reason, an output from the comparator $4c$ goes to "HIGH" regardless of the value of the cell $1c$. Similarly, outputs from the subsequent comparators go to "HIGH", the switching transistor of the final photocoupler 8 is turned off, and an input to the battery controller 6 goes to "LOW". In this manner, the presence of a cell having an overvoltage can be detected. For example, as shown in FIG. 6B, when the m-th cell has an overvoltage, outputs from the comparators following the m-th cell go to "HIGH".

An operation in inspection of an overvoltage detecting function will be described below.

When a control signal given from the battery controller 6 to the uppermost photocoupler $5a$ is set to "LOW", the input diode of the photocoupler $5a$ does not emit light. In this state, the switching transistor of the photocoupler $5a$ is turned off, and an output from the reference voltage generator $2a$ goes to almost 0. For this reason, the threshold value of the comparator $4a$ becomes $V_{limit}$ shown in FIG. 5. Even if the terminal voltage of the cell $1a$ is lower than the charge end voltage, an output from the comparator $4a$ goes to "HIGH". Therefore, the input diode of the second photocoupler $5b$ does not emit light. Similarly, the switching transistors of all the photocouplers are turned off regardless of the voltages of the cells, a signal (e.g., LOW) representing that the photocoupler 8 is in an OFF state is input to the battery controller 6. In this case, as shown in FIG. 6C, outputs from all the comparators go to "HIGH".

As described above, assume that it is expected that the terminal voltage of each cell of the combination battery is lower than the charge end voltage, e.g., assume that the combination battery is discharged (e.g., after traveling of an electric vehicle or before charging). In this case, if the overvoltage detecting function is normal, when a control signal given from the battery controller 6 to the uppermost photocoupler $5a$ is set to "HIGH", the photocoupler 8 is turned on (e.g., detection signal goes to "HIGH"). When the control signal is set to "LOW", the photocoupler 8 is turned off (e.g., detection signal goes to "LOW"). When the control signal given from the battery controller 6 to the uppermost photocoupler $5a$ is switched as described above, a detection signal from the photocoupler 8 changes in accordance with the control signal a short period of time after.

However, when abnormality occurs in the overvoltage detecting function, for example, when a failure occurs in which an output from any comparator is always set to "LOW" (equal to an output obtained at a normal voltage) regardless of an input, the photocoupler 8 is always kept in an ON state (for example, a detection signal is "HIGH"). When a failure occurs in which an output from any comparator is always set to "HIGH" (equal to an output obtained at an overvoltage) regardless of an input, the photocoupler 8 is always kept in an OFF state (for example, a detection signal is "LOW"). More specifically, when the terminal voltages of the cells of the combination battery are lower than the charge end voltage, the cells are normal in the following cases. That is, as shown in FIG. 7, outputs from all the comparators are "LOW" (photocoupler 8 is in an ON state) when the uppermost photocoupler $5a$ is set in an ON state (control signal is "HIGH"), and the outputs from all the comparators are "HIGH" (photocoupler 8 is in an OFF state) when the photocoupler $5a$ is "OFF" (control signal is "LOW"). Therefore, when the control signal given from the battery controller 6 to the uppermost photocoupler $5a$ is changed to "LOW", "HIGH", and "LOW" in this order, and, a short period of time after, the lowermost comparator $4n$ changes to "HIGH", "LOW", and "HIGH" in this order (photocoupler 8 is switched to "OFF", "ON", and "OFF" in this order). In this case, the overvoltage detecting function is normal. When a detection signal input from the photocoupler 8 does not change even if the control signal given to the uppermost photocoupler $5a$ is changed, it is determined that abnormality occurs.

Figure 8:
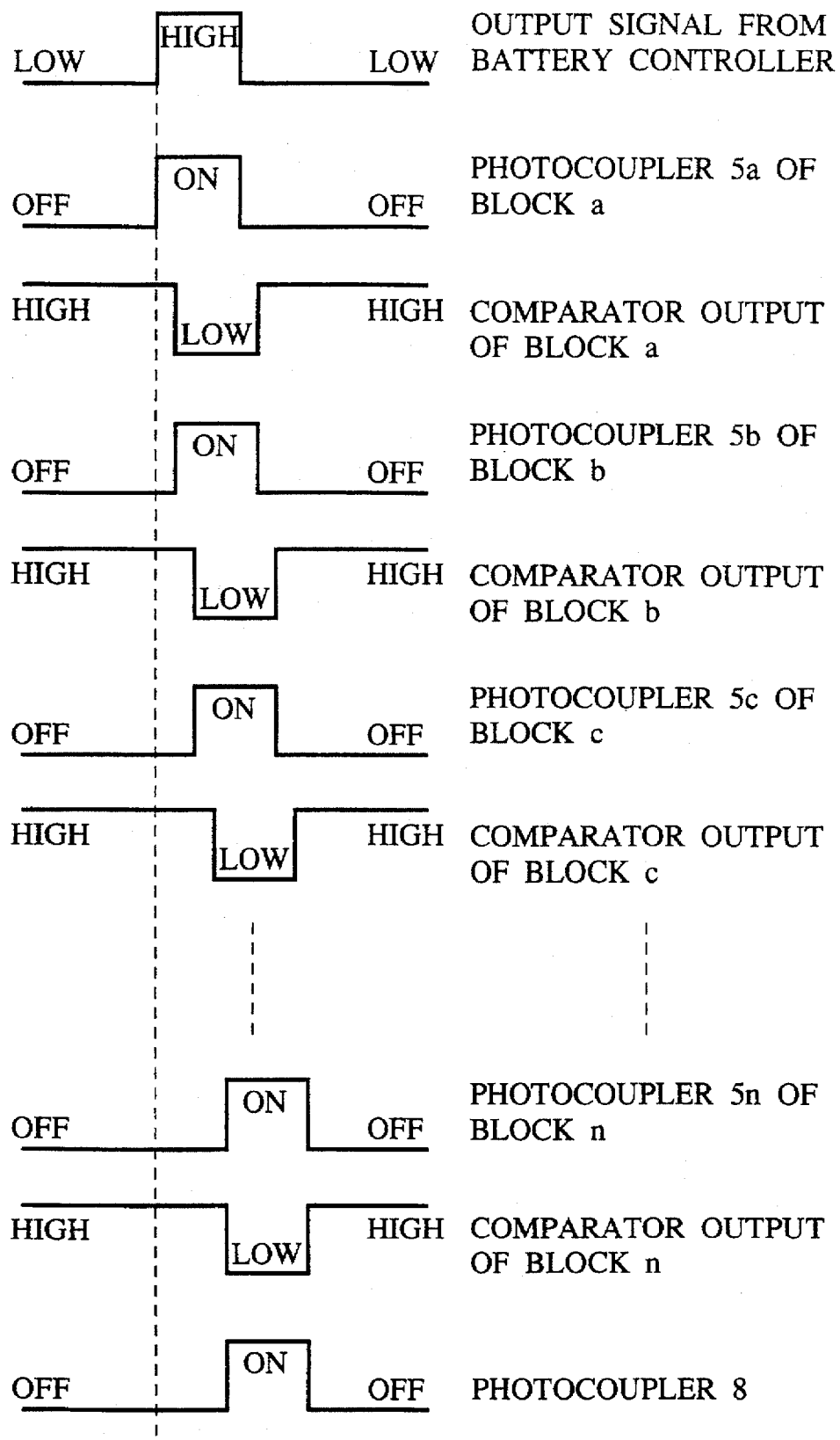
FIG. 8 is a waveform chart showing outputs of comparators in an inspection state.

FIG. 8 is a waveform chart showing signals in the above inspection, and shows waveforms obtained when the overvoltage detecting function is normal.

As shown in FIG. 8, when the control signal from the battery controller 6 is switched to "LOW", "HIGH", and "LOW" in this order, this state is sequentially transferred to each cell block. When an output from the comparator $4n$ of the final stage changes to "HIGH", "LOW", and "HIGH" in this order a short period of time after, the ON/OFF state of the final photocoupler 8 changes in accordance with the change in output from the comparator $4n$, and it is determined that the overvoltage detecting function is normal. When the output from the photocoupler 8 does not change even if the control signal is switched as described above, it can be determined that abnormality occurs. The above determination process is performed in the battery controller 6.

Since the above inspection operation must be performed when the terminal voltage of each cell of the combination battery is lower than the charge end voltage, the following arrangement may be used. That is, for example, in an electric vehicle, a program is set such that an inspection routine is automatically performed before charging is started or traveling, and the inspection is automatically performed when the main switch is turned on. The inspection result is displayed by turning on a lamp or displaying characters such as "abnormal".

Figure 9:
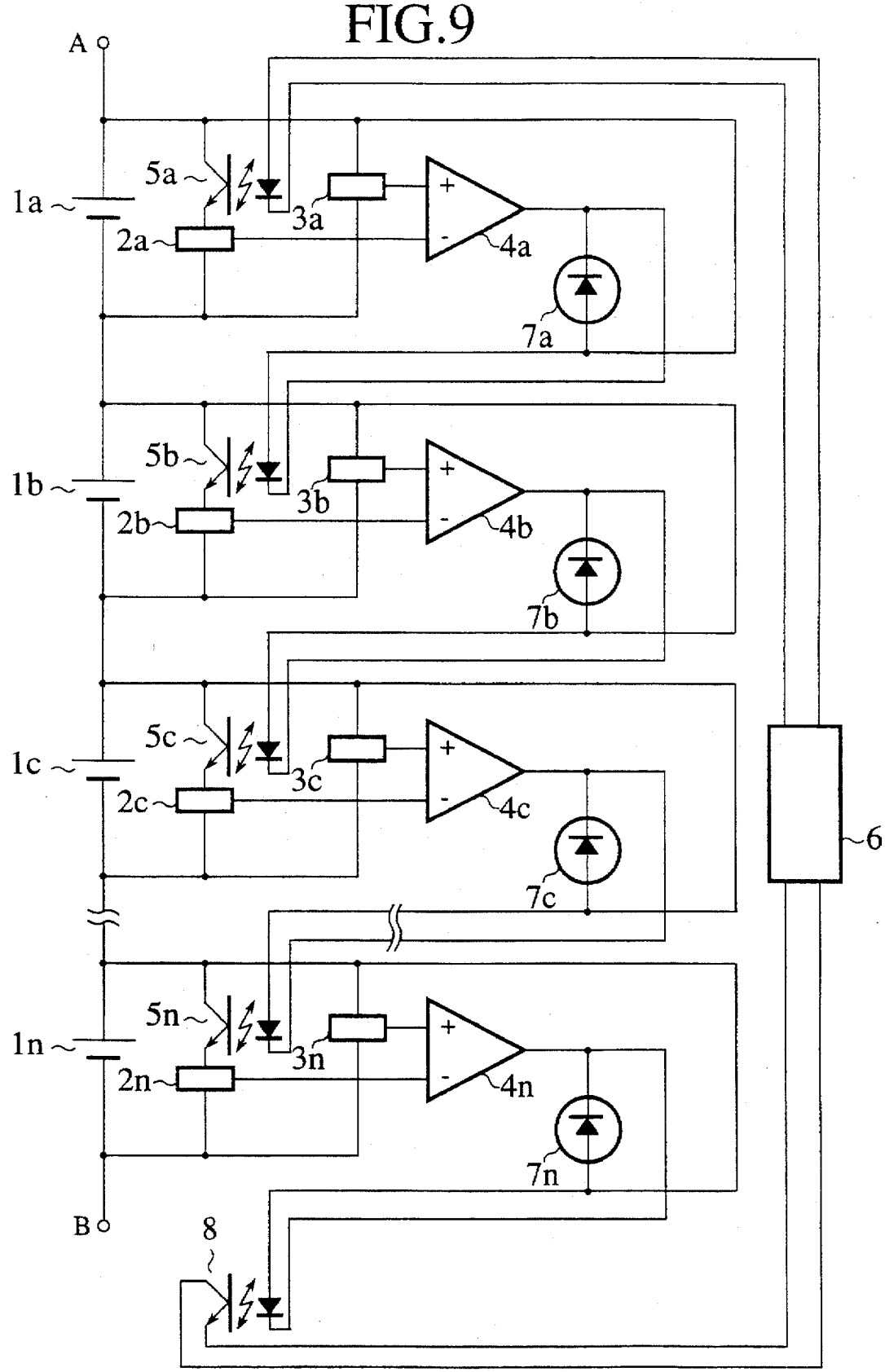
FIG. 9 is a circuit diagram showing the second embodiment of the present invention.

FIG. 9 is a circuit diagram showing the second embodiment of the present invention.

This embodiment is designed such that a light-emitting diode is connected to the output of each comparator of the circuit shown in FIG. 3 so as to display a cell having an overvoltage.

Referring to FIG. 9, reference numerals 7a to 7d denote light-emitting diodes which are connected to the outputs of respective comparators, respectively. The remaining arrangement is the same as that in FIG. 3.

Each light-emitting diode emits light when a comparator output is "LOW" (voltage of the cell falls within a normal range), and does not emit light when the comparator output is "HIGH". Therefore, when there is a cell having an overvoltage, all the light-emitting diodes following the cell do not emit light. For example, as in a case shown in FIG. 6B, although the a-th to (m-1)-th light-emitting diodes emit light, the light-emitting diodes following the m-th light-emitting diode do not emit light. For this reason, it is understood that the start cell, i.e., the m-th cell has an overvoltage. In this manner, a cell having an overvoltage can be displayed with a simple circuit.

When a light-emitting diode is connected between a comparator output and a ground potential (on the low-level side of a cell), in contrast to the above, the following arrangement can be obtained. That is, the light-emitting diodes of cells each having a normal voltage do not emit light, the light-emitting diodes following the cell having an overvoltage emit light.

Figure 10:
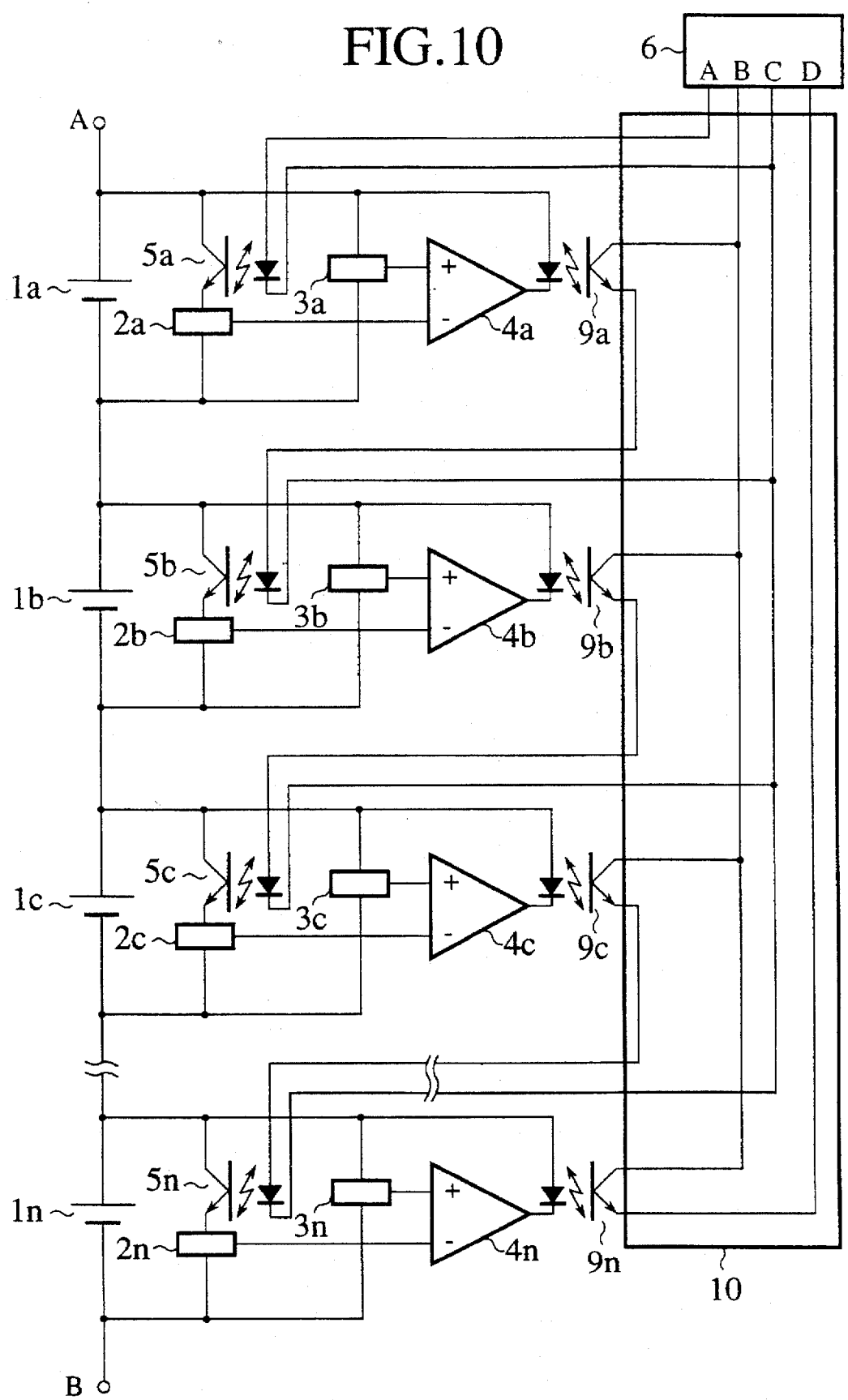
FIG. 10 is a circuit diagram showing the third embodiment of the present invention.

FIG. 10 is a circuit diagram showing the third embodiment of the present invention.

In this embodiment, cell blocks are constituted by the same arrangements, respectively, so that the manufacture and connection of the combination battery are made easy.

In each of the embodiments shown in FIGS. 3 and 9, since the output of the comparator 4n of the lowermost cell block is not insulated from the potential of the combination battery, the photocoupler 8 is arranged to insulate the output of the comparator 4n. Therefore, since an insulating type switching circuit such as a photocoupler described above must be arranged in the lowermost cell block, the blocks constituting the overvoltage detecting apparatus have different specifications, respectively. When cell blocks having the same arrangements are formed in a combination battery constituted by a large number of cells, the combination battery can be manufactured at a low cost. However, some arrangement is changed, the cost increases. Therefore, the combination battery is desirably manufactured using as many cell blocks having the same arrangements as possible.

This embodiment has been made to solve the above problem, the same function as that in FIG. 3 or 9 is realized by using cell blocks having the same arrangements.

Referring to FIG. 10, reference numerals 9a to 9n denote photocouplers, and reference numeral 10 denotes a harness for connecting a battery controller 6 to respective cell blocks. A terminal A of the battery controller 6 is a control signal output terminal for sending a control signal to the uppermost cell block, a terminal B is a power supply terminal for supplying power to the switching transistors of the respective photocouplers 9a to 9n, a terminal C is a ground terminal, and a terminal D is a detection signal input terminal for inputting an output from the lowermost cell block. The remaining arrangement is the same as that in FIG. 3.

In the circuit in FIG. 10, the output of the comparator 4a is connected to the input diode of the photocoupler 9a, and connected to the input diode of the next photocoupler 5b through the switching transistor of the photocoupler 9a. Power for the switching transistor of the photocoupler 9a is input from the power supply terminal B of the battery controller 6. Similarly, the outputs of the respective comparators are connected to the inputs of the next photocouplers through the photocouplers. As is apparent from FIG. 10, the switching transistors of the photocouplers 9a to 9n and the input diodes of the photocouplers 5a to 5n are insulated from the cells of the combination battery, so that power is supplied from the power supply terminal B of the battery controller 6. Therefore, since this arrangement is not influenced by the potentials of the respective cells of the combination battery, connection can be freely performed.

As described above, since outputs from the respective comparators are output while being insulated from the cells of the combination battery, the cell block of the lowermost cell 1n can be constituted by the same arrangement as that of each of other cell blocks, and all the cell blocks can be manufactured to have the same specifications. For this reason, the cost can be reduced.

In connection of the harness 10, a circuit obtained by connecting the switching transistors of the photocouplers 9a to 9n of the cell blocks and the input diodes of the photocouplers 5a to 5n is connected to the power supply terminal B and the ground terminal C of the battery controller 6, and the input diode of the uppermost photocoupler 5a is connected to the control signal input terminal A and the ground terminal C of the battery controller 6, so that one terminal of the switching transistor of the lowermost photocoupler 9n may be connected to the detection signal input terminal D.

Referring to FIG. 10, for example, when an output from the comparator 4a is "LOW" (in normal voltage), the input diode of the photocoupler 9a emits light, and the switching transistor is turned on. For this reason, the input diode of the next photocoupler 5b emits light, and the switching transistor is set to "ON", so that the reference voltage generator 2b generates a reference voltage.

Figure 11:
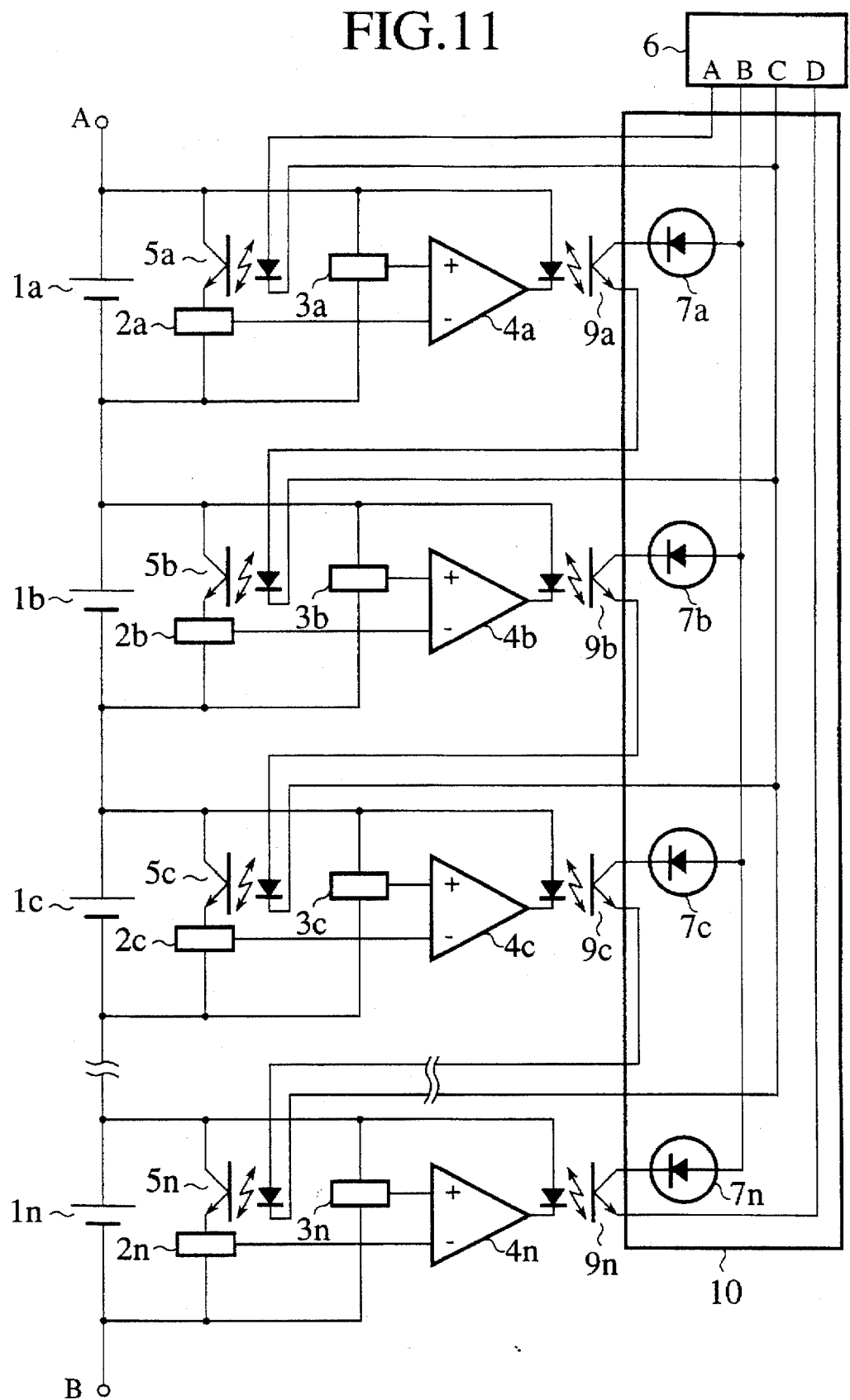
FIG. 11 is a circuit diagram showing the fourth embodiment of the present invention.

FIG. 11 is a circuit diagram showing the fourth embodiment of the present invention.

This embodiment can be obtained by combining light-emitting diodes 7a to 7n shown in FIG. 9 to the arrangement in FIG. 10.

Referring to FIG. 11, the light-emitting diodes 7a to 7n are connected between the switching transistors of the photocouplers 9a to 9n and the input diodes of the next photocouplers 5a to 5n. The remaining arrangement is the same as that in FIG. 10.

In this case, when there is a cell having an overvoltage, the switching transistors of the photocouplers 9a to 9n subsequent to the cell block of this cell are turned on, and the light-emitting diodes 7a to 7n subsequent to the cell block emit light.

The light-emitting diodes 7a to 7n may be connected to any portion between the power supply and series circuits respectively constituted by the switching transistors of the photocouplers 9a to 9n and the input diodes of the next photocouplers 5a to 5n. For example, when the cell block of the uppermost cell is exemplified, the light-emitting diode may be connected between the power supply terminal B of the battery controller 6 and the switching transistor of the photocoupler 9a, between the switching transistor of the photocoupler 9a and the input diode of the photocoupler 5b, or between the input diode of the photocoupler 5b and the ground terminal C of the battery controller 6.

Figure 12:
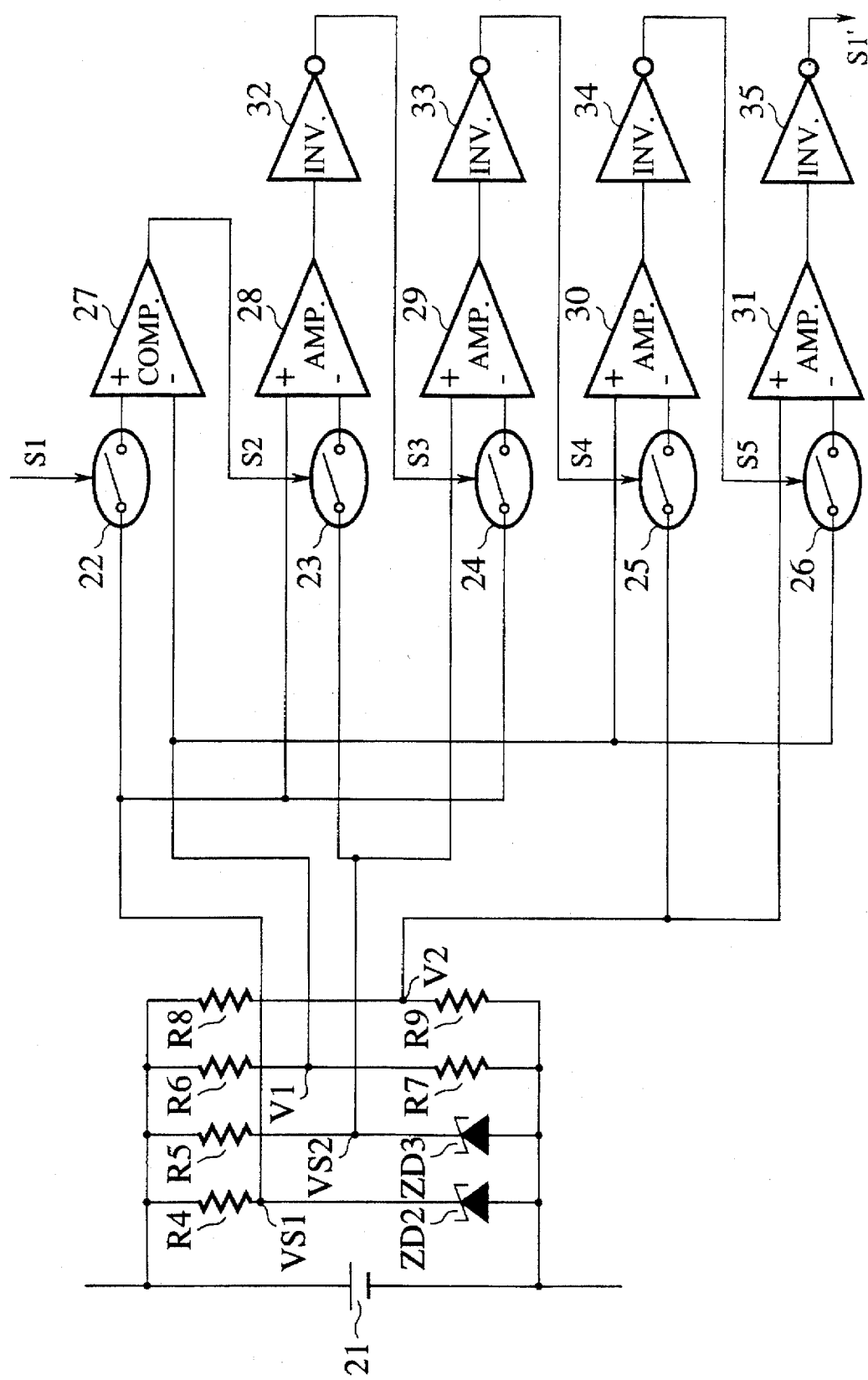
FIG. 12 is a circuit diagram showing the fifth embodiment of the present invention.

FIG. 12 is a block diagram showing the fifth embodiment of the present invention, and shows only a portion of one cell block in FIG. 3.

This embodiment has a function for checking abnormality of a reference voltage generator, a voltage divider, and the like.

In each of the embodiments shown in FIGS. 3 and 9 to 11 described above, abnormality of the overvoltage detecting function is detected by checking whether an output from the comparator is inverted when the reference voltage is set to 0. Therefore, the abnormality of the comparator can be detected. However, abnormality occurs in the reference voltage generator or the voltage divider, e.g., when the reference voltage to be a value corresponding to the charge end voltage is higher or lower than the charge end voltage, or when an output from the voltage divider becomes abnormal, abnormality cannot be detected. This embodiment is arranged such that abnormality of each circuit such as a reference voltage generator or a voltage divider constituting an overvoltage detecting apparatus can also be detected.

Referring to FIG. 12, reference numeral 21 denotes one of cells constituting a combination battery; 22 to 26, insulating type switching circuits (23 to 26 need not be of an insulating type); 27, a comparator; 28 to 31, differential amplifiers; 32 to 35, inversion circuits; R4 to R9, resistors; ZD2 and ZD3, zener diodes; and S1 to S5, control signal for switching.

The above circuit is arranged for each cell, and is connected such that an output S1' from the inversion circuit 35 is used as the control signal S1 of the switching circuit 22 of a cell of the next stage (next lower cell block). In the uppermost cell, the control signal S1 is given from a battery controller (not shown, the same as the battery controller 6 in FIG. 3 or the like), and an output S1' from the inversion circuit 35 serves as a detection signal for the battery controller.

The series circuit constituted by the resistor R4 and the zener diode ZD2 constitutes a first reference voltage generator for generating a first reference voltage VS1, and the series circuit constituted by the resistor R5 and the zener diode ZD3 constitutes a second reference voltage generator for generating a second reference voltage VS2. These reference voltages are voltages corresponding to the charge end voltage as in the above description, and set to satisfy VS1=VS2 (or VS1≈VS2). The series circuit constituted by the resistors R6 and R7 constitutes a first voltage divider, and outputs a voltage V1 obtained by dividing the terminal voltage of a cell 21. Similarly, the series circuit constituted by the resistors R8 and R9 constitutes a second voltage divider, and outputs a voltage V2. Note that the voltages V1 and V2 are set to satisfy V1=V2 (or VS1≈VS2).

The switching circuits 22 to 26 are photocouplers, electromagnetic relays, or the like described above, and switch input/output operations while being insulated from the respective control signal. Referring to FIG. 12, the switching circuits 22 to 26 are simply illustrated as circuits to be ON/OFF-controlled. In fact, as shown in FIG. 13, when each switching circuit is turned off, the switching circuit switches the comparator 27 or the differential amplifier such that the input terminals of the comparator 27 or the differential amplifier is grounded to a ground potential (potential on the low-level side of the cell 21). For example, when the switching circuit 22 is in an ON state, the first reference voltage VS1 is connected to the non-inversion input terminal (+) of the comparator 27; when the switching circuit 22 is in an OFF state, the first reference voltage VS1 is grounded to the ground potential. Although the switching circuits 23 to 26 may be of an insulating type like the switching circuit 22, the types of the switching circuits 23 to 26 need not be limited to the insulating type because the switching circuits 22 to 26 are operated in the same cell block. The comparator 27 and the differential amplifiers 28 to 31 are driven by power from the cells of the cell block to which these parts belong.

The first reference voltage generator constituted by the resistor R4 and the zener diode ZD2, the first voltage divider constituted by the resistors R6 and R7, the switching circuit 22, and the comparator 27 correspond respectively to the reference voltage generator 2a, the voltage divider 3a, the photocoupler 5a, and the comparator 4a in the previous embodiment to constitute an overvoltage detecting circuit.

The switching circuit 23 and the differential amplifier 28 constitute a circuit for detecting a deviation between the first reference voltage VS1 and the second reference voltage VS2, and output a voltage having an inverted potential of the inversion circuit 32 when the deviation between the voltages VS1 and VS2 (VS1>VS2) exceeds a predetermined allowance error. For example, the differential amplifier 28 has an amplification factor by which a signal amplified to the inverted potential of the inversion circuit 32 is output when the deviation is the maximum allowance error. Therefore, when the value VS1−VS2 is larger than the predetermined allowance error, an output S3 from the inversion circuit 32 is inverted to "LOW".

Similarly, the switching circuit 24 and the differential amplifier 29 constitute a circuit for detecting a deviation between the first reference voltage VS1 and the second reference voltage VS2. In this case, the value VS2−VS1 is larger than the predetermined allowance error, an output S4 from the inversion circuit 33 is inverted to "LOW".

The switching circuit 25 and the differential amplifier 30 constitute a circuit for detecting a deviation between the output V1 from the first voltage divider and the voltage V2 from the second voltage divider. When the value V1−V2 is larger than the predetermined allowance error, an output S5 from the inversion circuit 34 is inverted to "LOW".

Similarly, the switching circuit 26 and the differential amplifier 31 constitute a circuit for detecting a deviation between the output V1 from the first voltage divider and the voltage V2 from the second voltage divider. In this case, the value V2−V1 is larger than the predetermined allowance error, an output S1' from the inversion circuit 35 is inverted to "LOW".

Although not shown in FIG. 12, the output S1' from the last inversion circuit 35 of the lowermost cell block, as in FIG. 3, is sent to the battery controller through the photocoupler.

An operation will be described below.

Assume that the comparator 27, all of the differential amplifiers 28 to 31, the inversion circuits 32 to 35, the first reference voltage generator, the second reference voltage generator, the first voltage divider, and the second voltage divider are normal, and that the terminal voltage of the cell 21 is set within a normal range (lower than the charge end voltage). In this case, the control signal S1 sent from a battery controller (not shown) is set to "HIGH", the switching circuit 22 is turned on. In this case, since VS1>V1 is satisfied, an output S2 from the comparator 27 goes to "HIGH", and the switching circuit 23 is turned on. For this reason, the second reference voltage VS2 is connected to the inversion input terminal (−) of the differential amplifier 28. In this case, since the deviation between the voltages VS1 and VS2 is set within the range of the allowance error, an output S3 from the inversion circuit 32 goes to "HIGH", and the next switching circuit 24 is turned on. Subsequently, the switching circuits 25 and 26 are turned on, the output S1' from the last inversion circuit 35 goes to "HIGH", and the output. S1' is sent to the switching circuit 22 in the cell block of the next stage. In this manner, the same determination as described above is performed. The "HIGH" signal of the output S1' from the inversion circuit 35 of the lowermost cell is sent to the battery controller.

Assume that all the circuits are normal, and that the terminal voltage of the cell 21 is equal to or larger than the charge end voltage. In this case, when a "HIGH" signal is sent as the control signal S1, the output S2 from the comparator 27 goes to "LOW" because VS1<V1 is satisfied. For this reason, since the switching circuit 23 is turned off, an output from the differential amplifier 28 becomes equal to or larger than an inversion level regardless of the values of VS1 and VS2, and the output S3 from the inversion circuit 32 goes to "LOW". Similarly, the insulating type switching circuits 24 to 26 are turned off, the output S1' from the last inversion circuit 35 goes to "LOW", and the "LOW" signal is sent to the switching circuit 22 in the cell block of the next stage. For this reason, all the switching circuits of the next stage are sequentially turned off, and this state is sequentially sent to the cell blocks to send the "LOW" signal of the output S1' from the inversion circuit 35 to the battery controller.

On the other hand, when a "LOW" signal is given as the control signal S1, the output S2 from the comparator 27 goes to "LOW" regardless of the values of VS1 and V1. As in the above description, the "LOW" signal of the output S1' from the inversion circuits 32 to 35 of the lowermost cell is sent to the battery controller.

As described above, in the case that all the circuits are normal, and that the terminal voltage of the cell 21 is lower than the charge end voltage (before charging or the like), when the control signal S1 is set to "HIGH", the output S1' (detection signal) from the inversion circuit 35 of the lowermost cell goes to "HIGH", while when the control signal S1 is set to "LOW", the output S1' goes to "LOW". This means that the detection signal S1' follows the control signal S1.

Next, assume that the comparator 27 is out of order, and that the output signal S2 from the comparator 27 always keeps "HIGH" (normal side). In this case, even when the control signal S1 is set to "LOW", the detection output S1' always keeps "HIGH". When the deviation between the first reference voltage VS1 and the second reference voltage VS2 becomes equal to or larger than the predetermined allowance range, an output from the inversion circuit 32 (in a case that VS1>VS2) or the inversion circuit 33 (in a case that VS1<VS2) is always set to "LOW". For this reason, even when the control signal S1 is set to "HIGH", the detection output S1' always keeps "LOW". When the deviation between the output V1 from the first voltage divider and the voltage V2 from the second voltage divider becomes equal to or larger than the predetermined allowance range, an output from the inversion circuit 34 (in a case that V1>V2) or the inversion circuit 35 (in a case that V1<V2) is always set to "LOW". For this reason, even when the control signal S1 is set to "HIGH", the detection output S1' always keeps "LOW".

The summary of the above operation is shown in FIGS. 14A and 14B.

In an overvoltage determination mode (in normal operation state) shown in FIG. 14A, the control signal S1 is set to "HIGH". In this state, the detection signal set to "HIGH" means that the terminal voltage of the cell is set within a normal range (lower than the charge end voltage), and the detection signal set to "LOW" means that the terminal voltage is an overvoltage.

In an inspection mode (in a state wherein the terminal voltage of the cell 21 is lower than the charge end voltage: performed before charging) shown in FIG. 14B, assume that the control signal S1 changes to "HIGH", "LOW", and "HIGH" in this order. In this case, when the detection signal S1' changes to "HIGH", "LOW", and "HIGH" in the same order, all the circuits are normal. The output S1' which is fixed to "HIGH" even when the control signal S1 is changed means that the comparator 27 is out of order to be fixed to "HIGH". When the detection signal S1' is fixed to "LOW", it is determined that the reference voltage generator or the voltage divider is out of order. This determination is performed in the battery controller.

Although not shown in FIG. 14, when the comparator 27 is out of order to be fixed to "LOW", the detection signal S1' is always fixed to "LOW". When any one of the differential amplifiers 28 to 31 is out of order to have no output (LOW), the detection signal S1' is fixed to "HIGH". In contrast to this, when any one of the differential amplifiers 28 to 31 is out of order to be saturated by the power supply voltage, the detection signal S1' is fixed to "LOW". When any one of the inversion circuits 32 to 35 is out of order to fix an output from corresponding one of the inversion circuits to "HIGH", the detection signal S1' is fixed to "HIGH". When any one of the inversion circuits 32 to 35 is out of order to fix an output from corresponding one of the inversion circuits to "LOW", the detection signal S1' is fixed to "LOW".

As described above, when abnormality occurs in any one of the circuits constituting the apparatus, a signal is prevented from being transmitted from the upper cell block to the lower cell block. For this reason, the normality/abnormality of the apparatus can be determined by checking whether signal transmission is normally performed.

In the above description, the present invention is described as an overvoltage detecting apparatus. However, when the present invention is practically used, the present invention can be applied to a charge protective apparatus which ends charging in detection of an overvoltage or controls a bypass circuit to suppress overcharging.

As has been described above, according to the present invention, the following effects can be obtained. That is, an overvoltage of cells constituting a combination battery can be detected, and the normality/abnormality of an overvoltage detecting function can be easily determined.

In the second aspect of the present invention, a cell having an overvoltage can be easily displayed.

In the third aspect of the present invention, since an output from each comparator is output while being insulated from the cells of the combination battery, the lowermost cell block can be constituted by the same arrangement as that of each of other cell blocks, and all the cell blocks can be manufactured to have the same specifications. Therefore, the cost can be reduced.

In the fourth aspect of the present invention, the following effect can be obtained. That is, not only abnormality of a comparator but also abnormality of each circuit such as a reference voltage generator or a voltage divider constituting an overvoltage detecting apparatus can be detected.

It should be understood that many modifications and adaptations of the invention will become apparent to those skilled in the art and it is intended to encompass such obvious modifications and changes in the scope of the claims appended hereto.

What is claimed is:

1. An overvoltage detecting apparatus, for a combination battery, which detects an overvoltage of each cell of said combination battery constituted by connecting a plurality of secondary battery cells in serial or in serial-parallel with each other, comprising:

reference voltage generation means for generating a reference voltage corresponding to a charge end voltage by using a terminal voltage of said cell;

voltage division means for dividing the terminal voltage of said cell at a predetermined division ratio;

comparison means for comparing an output from said reference voltage generation means and an output from said voltage division means with each other;

insulating type first switching means connected to perform an ON/OFF operation between said cell and said reference voltage generation means in accordance with a control signal;

said means being arranged for each cell block, and the cell blocks of said combination battery being sequentially connected to each other such that an output from said comparison means of said cell block whose cell potential is higher by one is used as a control signal of said switching means, and control means for supplying a control signal to said first switching means of said cell block having the highest potential, inputting an output from said comparison means of said cell block having the lowest potential as a detection signal, fixing the control signal in a normal operation, determining an overvoltage by the detection signal, changing the control signal in a predetermined order in inspection, and determining the normality/abnormality of an overvoltage detecting function by checking whether the detection signal follows the change of the control signal.

2. An overvoltage detecting apparatus for a combination battery, according to claim 1, wherein a light-emitting diode for emitting light in accordance with an output from said comparison means is arranged for each cell block of said combination battery so as to display a cell having an overvoltage.

3. An overvoltage detecting apparatus for a combination battery, according to claim 1, wherein an insulating type second switching means which uses an output from said comparison means as a control signal and performs switching while being insulated from said cell is arranged for each of said cell blocks, so that the control signal is transmitted from said comparison means of a cell block having an upper potential to said first switching means of a cell block having a lower potential through said second switching means.

4. An overvoltage detecting apparatus, for a combination battery, which detects an overvoltage of each cell of said combination battery constituted by connecting a plurality of secondary battery cells in serial or in serial-parallel with each other, comprising:

first reference voltage generation means for generating a reference voltage corresponding to a charge end voltage by using a terminal voltage of said cell, and second reference voltage generation means having the same arrangement as that of said first reference voltage generation means;

first voltage division means for dividing the terminal voltage of said cell at a predetermined division ratio, and second voltage division means having the same arrangement as that of said first voltage division means;

insulating type switching means for switchably outputting an output from said first reference voltage generation means and a ground potential in accordance with a control signal, the control signal being insulated from an input/output;

comparison means for comparing an output from said insulating type switching means and an output from said first voltage division means;

a first block constituted by first switching means for switchably outputting an output from said second reference voltage generation means and a ground potential in accordance with the control signal, a first amplification means for sending an output for inverting a first inversion means when a difference between an output from said first reference voltage generation means and an output from said first switching means exceeds a predetermined allowance error, and said first inversion means connected to an output of said first amplification means;

a second block constituted by second switching means for switchably outputting an output from said first reference voltage generation means and a ground potential in accordance with the control signal, a second amplification means for sending an output for inverting a second inversion means when a difference between an output from said second reference voltage generation means and an output from said second switching means exceeds a predetermined allowance error, and said second inversion means connected to an output of said second amplification means;

a third block constituted by third switching means for switchably outputting an output from said second voltage division means and a ground potential in accordance with the control signal, a third amplification means for sending an output for inverting a third inversion means when a difference between an output from said first voltage dividing means and an output from said third switching means exceeds a predetermined allowance error, and said third inversion means connected to an output of said third amplification means;

a fourth block constituted by fourth switching means for switchably outputting an output from said first voltage division means and a ground potential in accordance with the control signal, a fourth amplification means for sending an output for inverting a fourth inversion means when a difference between an output from said second voltage dividing means and an output from said fourth switching means exceeds a predetermined allowance error, and said fourth inversion means connected to an output of said fourth amplification means;

said means and blocks being arranged for each cell, said first to fourth blocks being arranged in an arbitrary order, and being sequentially connected to each other such that an output from said comparison means is given as a control signal of said switching means of the first block, and an output from said inversion means of each block is used as a control signal of said switching means of said next block, and said cell blocks of said combination battery being sequentially connected to each other such that an output from said inversion means of said last block of said cell block whose cell potential is higher by one is used as a control signal of said insulating type switching means, and control means for supplying a control signal to said insulating type switching means of a cell block having the highest potential, inputting an output from said inversion means of said last block of a cell block having the lowest potential as a detection signal, fixing the control signal in a normal operation, determining an overvoltage by the detection signal, changing the control signal in a predetermined order in inspection, and determining the normality/abnormality of an overvoltage detecting function by checking whether the detection signal follows the change of the control signal.

* * * * *